(12) United States Patent
Carter

(10) Patent No.: US 8,611,134 B2  
(45) Date of Patent: Dec. 17, 2013

(54) SYSTEMS AND METHODS FOR ROW-WIRE VOLTAGE-LOSS COMPENSATION IN CROSSBAR ARRAYS

(75) Inventor: Richard J. Carter, Los Altos, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 13/383,622

(22) PCT Filed: Mar. 25, 2010

(86) PCT No.: PCT/US2010/028594  
§ 371 (c)(1),  
(2), (4) Date: Jan. 12, 2012

(87) PCT Pub. No.: WO2011/119158  
PCT Pub. Date: Sep. 29, 2011

(65) Prior Publication Data  
US 2013/0010521 A1    Jan. 10, 2013

(51) Int. Cl.  
*G11C 11/21* (2006.01)  
*B82Y 10/00* (2011.01)

(52) U.S. Cl.  
USPC .......................... 365/148; 977/762; 977/943

(58) Field of Classification Search  
None  
See application file for complete search history.

(56) References Cited

U.S. PATENT DOCUMENTS

| | | | |
|---|---|---|---|
| 2005/0169038 A1* | 8/2005 | Inoue et al. | 365/148 |
| 2006/0221712 A1 | 10/2006 | Lowrey et al. | |
| 2006/0227592 A1 | 10/2006 | Parkinson et al. | |

* cited by examiner

*Primary Examiner* — Hoai V Ho  
*Assistant Examiner* — James G Norman (57) ABSTRACT

Embodiments of the present invention are directed systems and methods for reading the resistance states of crossbar junctions of a crossbar array. In one aspect, a system includes one or more sense amplifiers connected to column wires of the crossbar array, a reference row wire connected to each sense amp, and a wire driver connected to the reference row wire and configured to drive the reference row wire. The sense amplifiers are configured so that when a selected row wire of the crossbar array is driven by a sense voltage, the column wires are held at approximately zero volts and pass currents through the column wires and sense amplifiers to the reference row wire so that resistive voltage losses along the reference row wire substantially mirror the resistive voltage losses along the selected row wire, allowing the sense amplifiers to determine the crossbar junction resistance states.

15 Claims, 9 Drawing Sheets

SYSTEMS AND METHODS FOR ROW-WIRE VOLTAGE-LOSS COMPENSATION IN CROSSBAR ARRAYS

STATEMENT OF GOVERNMENT INTEREST

This invention has been made with Government support under Contract No. HR001 1-09-3-000, awarded by the Defense Advanced Research Projects Agency. The government has certain rights in the invention.

TECHNICAL FIELD

Embodiments of the present invention relate to microscale and nanoscale electronic devices, and in particular, to crossbar arrays.

BACKGROUND

During the past fifty years, the electronics and computing industries have been relentlessly propelled forward by ever decreasing sizes of basic electronic components, such as transistors and signal wires, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding photolithographic methods may need to be employed. Expensive semiconductor fabrication facilities may need to be rebuilt in order to implement the photolithographic methods. Many new obstacles may be encountered. For example, semiconductor devices are photolithographically fabricated in a series of steps. The masks used in each step are precisely aligned with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to semiconductor fabrication.

In view of these problems, researchers and developers have expended considerable research efforts in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general wire technologies have been developed, it is not necessarily straightforward to employ nanowire technologies to miniaturize existing types of circuits and structures. While it may be possible to tediously construct miniaturized, nanowire circuits similar to the much larger, currently available circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Designers, manufacturers, and users of logic circuits and memory continue to seek new nanoscale electronic components and electronic devices.

DETAILED DESCRIPTION

Figure 1:
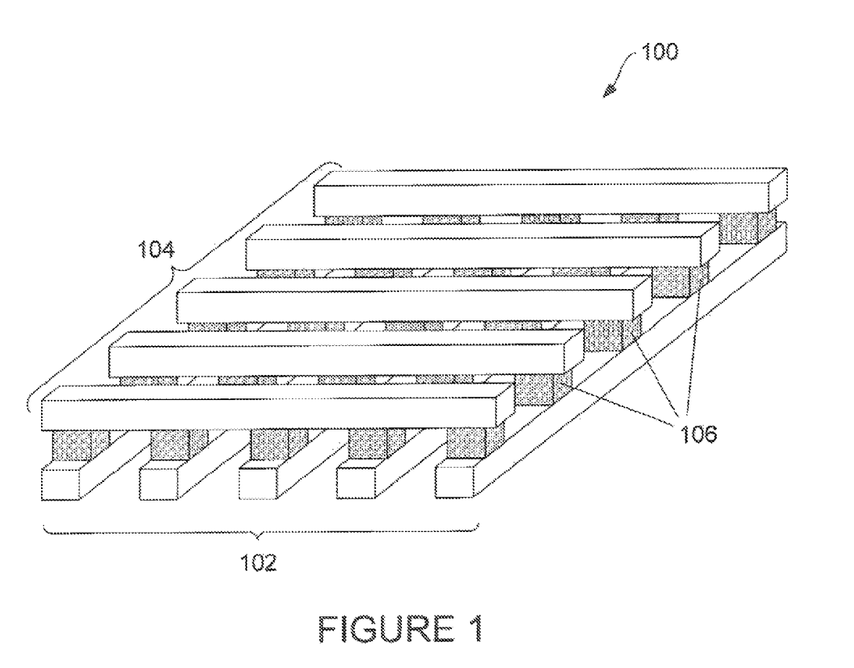
FIG. 1 shows an isometric view of a crossbar array configured in accordance with one or more embodiments of the present invention.

Embodiments of the present invention are directed systems and methods for reading the resistance states of crossbar junctions of a crossbar array. FIG. 1 shows an isometric view of a crossbar array 100 configured in accordance with one or more embodiments of the present invention. The crossbar array 100 is composed of a first layer of approximately parallel wires 102 called "column wires" that are overlain by a second layer of approximately parallel wires 104 called "row wises." The row wires are approximately perpendicular, in orientation, to the column wires, although the orientation angle between the layers may vary. The two layers of wires form a lattice, or crossbar, each wire of the second layer 104 overlying all of the wires of the first layer 102 and coming into close contact with each wire of the first layer 102 at wire intersections that represent the closest contact between two overlapping wires. Wire intersections connected by devices 106 are called "crossbar junctions." Although individual wires in FIG. 1 are shown with rectangular cross sections, the wires can also have square, circular, elliptical, or more complex cross sections. The wires may also have many different widths or diameters and aspect ratios or eccentricities.

The term "wire" may refer to nanowires with widths or diameters of less that about 100 nm or to microscale wires with widths or diameters of greater than 100 nm and less than about 100 μm. Also, the term "wire" is used here in place of the term "line," which is also commonly used in the literature, as in the usage "row and column lines," "line widths," etc. The term "crossbar" may refer to crossbars having one or more layers of nanowires, sub-microscale wires, microscale wires, or wires with larger dimensions.

Wire layers can be fabricated by mechanical nanoimprinting techniques. Alternatively, wires can be chemically synthesized and can be deposited as layers of approximately parallel wires in one or more process steps, including Langmuir-Blodgett processes. Other alternative techniques for fabricating wires may also be employed. Thus, a two-layer wire crossbar comprising first and second layers, as shown in FIG. 1, can be manufactured by any of numerous relatively straightforward processes. Many different types of conductive and semi-conductive wires can be chemically synthesized from metallic and semiconductor substances, from combinations of these types of substances, and from other types of substances. A wire crossbar may be connected to microscale address-wire leads or other electronic leads, through a variety of different methods in order to incorporate the wires into electrical circuits.

Figure 2A:
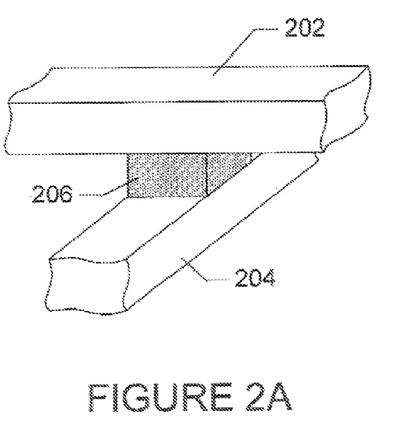
FIGS. 2A-2B show a crossbar junction and a memristor circuit element, respectively, in accordance with one or more embodiments of the present invention.
Figure 2B:
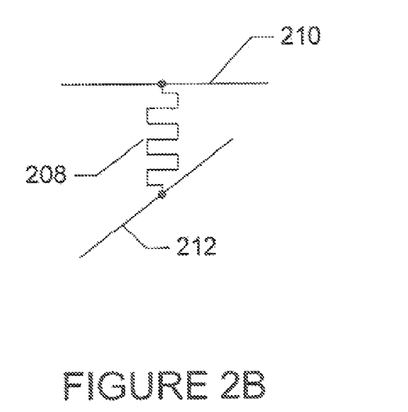

FIG. 2A shows a crossbar junction that interconnects wires 202 and 204 of two contiguous layers within a crossbar that represents one or more embodiments of the present invention. The crossbar junction may or may not involve physical contact between the two wires 202 and 204. As shown in FIG. 2A, the two wires are not in physical contact at their overlap point, but the gap between the wires 202 and 204 is spanned by a device 206 that lies between the two wires at their closest overlap point. The devices 106 and 206 at crossbar junctions can be memristors. Memristors can be used as resistive analog memories that are capable of storing resistance state information with very little decay for long periods of time, such as days, weeks, months, and possibly years. In other words, a memristor crossbar junction can be used as a memory cell. For example, a single bit can be stored in each memristor crossbar junction of a crossbar array using the high-resistance state of the memristor to represent a logic "0" bit value and the low-resistance state to represent a logic "1" bit value, or vice versa, depending on the convention selected. The bit value stored at a crossbar junction can be "read" or "sensed" by determining the resistance state of the crossbar junction. FIG. 2B shows a circuit symbol 208 that represents the memristor 206 and lines 210 and 212 that represent the wires 202 and 204, respectively.

Figure 3:
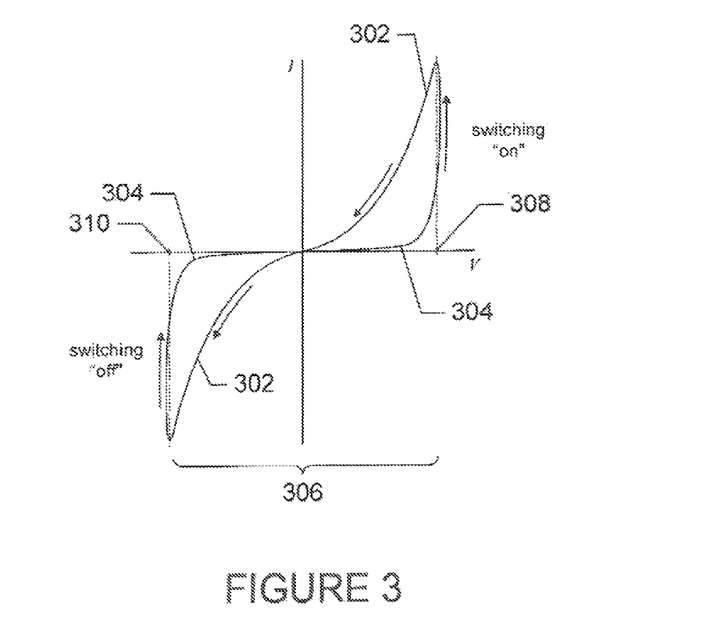
FIG. 3 shows current versus voltage characteristics of a memristor crossbar junction in accordance with one or more embodiments of the present invention.

FIG. 3 shows a plot of current I versus voltage V for a memristor located at a nanoscale crossbar junction. Curve 302 represents the current of the memristor in a low-resistance state over a domain of voltages, and curve 304 represents the current of the memristor in a high-resistance state over the same domain of voltages. Low voltages within the voltage interval 306 have negligible affect on the resistance state of the memristor, while larger magnitude voltages can change the resistance state of the memristor. A positive voltage greater than the positive "on" threshold 308 causes the memristor to switch from the high-resistance state into the low-resistance state. On the other hand, a voltage less than the negative "off" threshold 310 causes the memristor to switch from the low-resistance state into the high-resistance state.

FIG. 3 shows one example of memristor behavior. Other types of memristors may have a more gradual transition region from non-switching to switching behavior, or may have the opposite polarity of on-switching and off-switching voltages to that shown.

Typically, the resistance states of crossbar junctions can be read by applying an appropriate voltage to a selected row wire and measuring the voltage and/or current on selected column wires using sense amplifiers ("sense amps"). A sense amp is an electronic circuit used to determine the logic bit value stored in a memory cell, such as the memory cell at a memristor crossbar junction.

Figure 4:
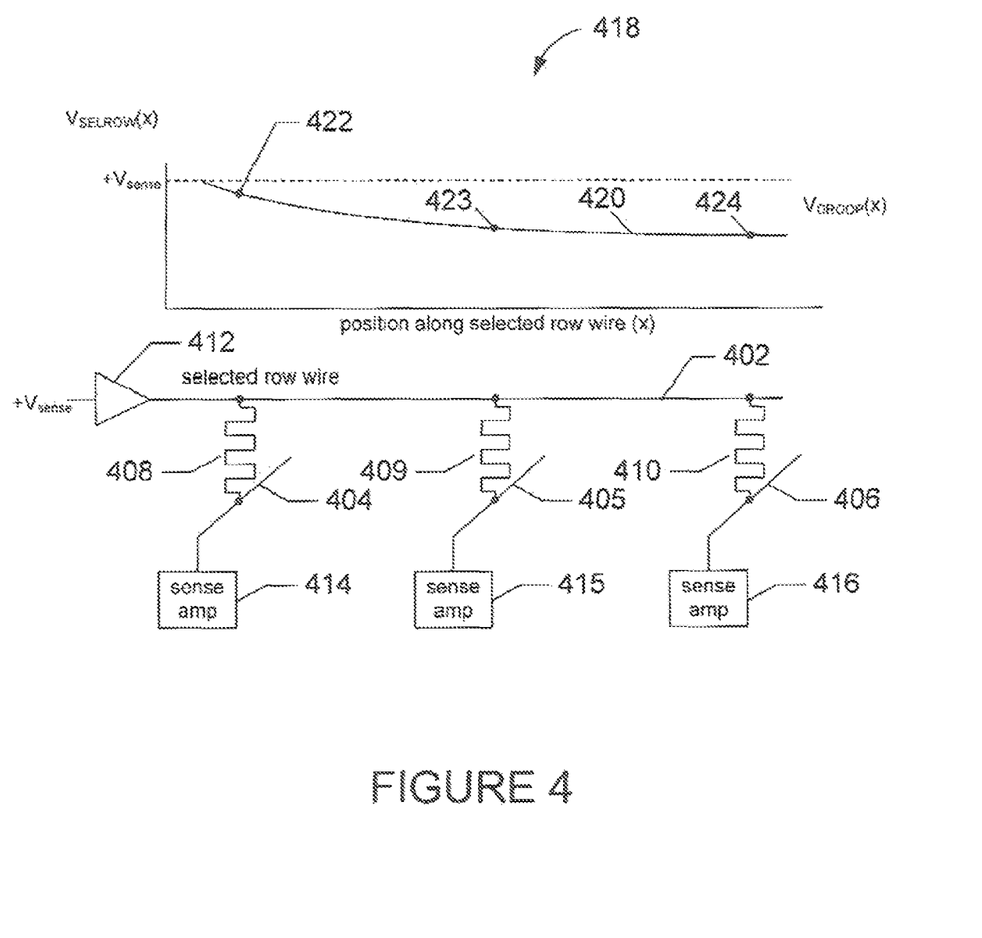
FIG. 4 shows a circuit diagram of a single row wire and three column wires of a crossbar array connected by memristors in accordance with one or more embodiments of the present invention.

FIG. 4 shows a circuit diagram of a single row wire 402 and three column wires 404-406 of a crossbar array connected by memristors 408-410 in accordance with one or more embodiments of the present invention. The row wire 402 is connected to row wire driver 412 and the column wires 404-406 are connected to sense amps 414-416, respectively. Ideally, the row wire driver 412 applies a voltage to the row wire 402 and the sense amps 414-416 determine the respective resistance state, or logic bit value, of associated memristors 408-410.

Note that as the size of crossbar junctions and row and column wire cross-sectional dimensions decrease, the wire resistance per unit length increases. This increase in resistance overshadows the resistance-decreasing effect of shortened row and column wires that may result from decreased crossbar junction dimensions. Thus, as layout dimensions decrease, a row or column wire connecting a number of crossbar junctions will have a net increase in resistance. In particular, this increased resistance produces a gradual voltage decline, or decrease, along a selected row wire as the voltage driven by the row wire driver forces current through the row wire and the selected crossbar junctions. The voltage decline can be characterized as a "voltage droop." FIG. 4 includes a plot 418 of voltage represented by curve 420 along the selected row wire 402. Points 422-424 represent the voltages measured on the selected row wire at the connection points of memristors 408-410, respectively, with the memristors passing sufficient current to create a voltage droop along the row wire. Given a row wire crossing $N_{col}$ columns, forming $N_{col}$ memristors that are by assumption here in the same resistance state, the voltage droop measured at the memristor connection point farthest from the row wire driver is approximately proportional to $N_{col}^2$.

In theory, memory read circuits can determine selected crossbar junction resistance states based on the measured column wire current and with the knowledge of the voltage across the selected crossbar junctions. However, in practice, the voltage droop along a selected row wire is problematic, because sense amps can only measure the voltage on the near column-wire-side of the memristor, and have no way of measuring the far row-wire-side voltage. A sense amp typically measures the column wire current while holding the column wire voltage to a reference voltage. The measured column wire current along with knowledge of the voltage across the selected crossbar junction enables the memory read circuits to determine the selected crossbar junction resistance state. The voltage across a selected crossbar junction, in the absence of any IR-losses in the row wire, is equal to the voltage driven by the row wire driver, shown as +Vsense in FIG. 4, minus the column wire reference voltage established by the column sense amp. This voltage value is decreased by any IR-loss in the row wire (i.e. voltage droop), which is generally undetected by the sense amp. This IR-loss cannot be predicted in advance of the row wire read operation, since the current flow in the wire depends on the resistive state of the memristors being read. Thus, the unknown voltage droop along a selected row wire represents an error term in the selected crossbar junction's resistance state, as determined by the column sense amp. The system and method embodiments now described are directed to compensating for a selected row wire voltage droop so that determination of a crossbar junction resistance state at a sense amp is nearly unaffected by the voltage droop.

Figure 5:
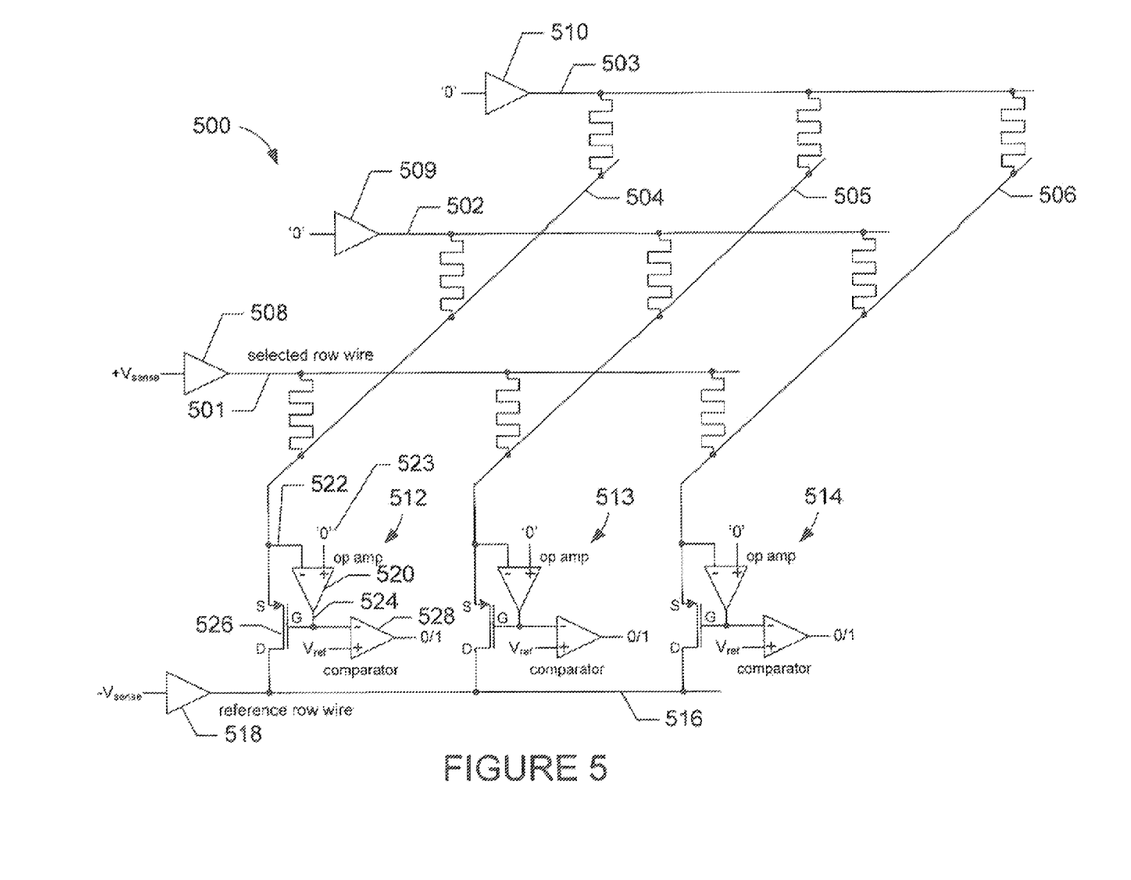
FIG. 5 shows an example circuit diagram of a crossbar array and sense amps configured in accordance with embodiments of the present invention.

FIG. 5 shows an example circuit diagram of a crossbar array 500 and sense amps configured in accordance with embodiments of the present invention. The crossbar array includes three row wires 501-503, three column wires 504-506, and memristors at crossbar junctions. Row wires 501-503 are driven by row wire drivers 508-510. Column wires 504-506 are connected to sense amps 512-514, respectively, which are, in turn, connected to a reference row wire 516 driven by a row wire driver 518. As shown in FIG. 5, sense amps 512-514 are configured with the same arrangement of circuit components. Thus, for the sake of convenience and brevity, only the circuit components of the sense amp 512 are now described. Sense amp 512 includes an operational amplifier ("op amp") 520 with one input 522 connected to the column wire 504 and another input connected to a separate voltage source 523. The op amp 520 output 524 is connected to a gate of a field-effect transistor ("FET") 526 and an input of a comparator 528. In this embodiment of the invention, the FET 526 is a P-channel device with the source, drain, and gate of each FET identified in FIG. 5 by S, D, and G, respectively. The source terminal is also indicated using the standard convention with an arrow. The source and drain of the FET 526 are connected to the column wire 504 and the reference row wire 516, respectively. The comparator 528 receives a reference voltage, $V_{ref}$, and compares $V_{ref}$ with the voltage output from op amp 520 to determine the resistance state of the selected memristor.

In order to determine the resistance states of a row of memristors, a selected row wire is driven with a sense voltage, $+V_{sense}$, and unselected row wires are driven with approximately 0 volts. All column wires are used to read the resistance states of the memristors of the selected row through respective sense amps that hold their columns wires at a virtual '0' volts. For example, suppose it is desired to read the resistance states of the memristors connecting the row wire 501 to the column wires 504-506. Row wire 501 is the selected row wire and row wires 502 and 503 are not selected row wires. As shown in the example of FIG. 5, row wire driver 508 applies $+V_{sense}$ to selected row wire 501 and 0 volts are applied to row wires 502 and 503. Additionally, reference row wire driver 518 applies $-V_{sense}$ to reference row wire 516.

Figure 6:
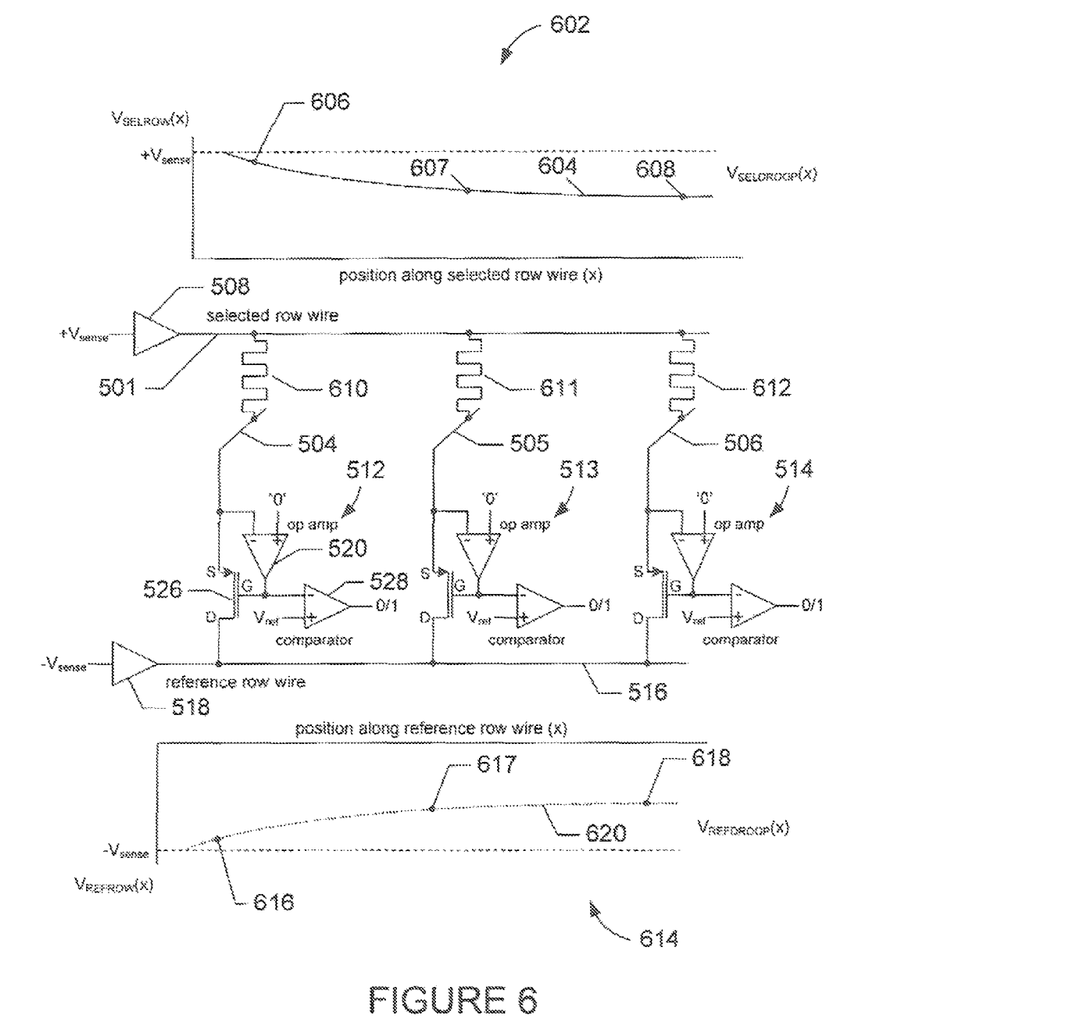
FIG. 6 shows a circuit diagram of a selected row wire and column wires of the crossbar array shown in FIG. 5 in accordance with one or more embodiments of the present invention.

FIG. 6 shows a circuit diagram of selected row wire 501 and column wires 504-506 and includes a plot 602 of voltage along the selected row wire 501 represented by curve 604. Curve 604 shows an initial voltage value of $+V_{sense}$, as driven by the row wire driver 508, degraded by an ever-increasing voltage droop. Points 606-608 represent the voltages applied to memristors 610-612, respectively, which create currents that flow through the memristors 610-612 into the column wires 504-506. Because the sense amps 512-514 all operate in the same manner to sense the column wire current that passes through a corresponding memristor, only the operation of the sense amp 512 is now described. Current flows from the column wire, 504 into the FET 526. The voltage on the column wire 504 is sensed by the inverting input of the op amp 520. The op amp 520 outputs a voltage $V_G$ that is fed to the FET 526 gate G input. Because the operation of the column sense amp 512 forces the column wire 504, and consequently the FET 526 source S input, to a virtual '0' volts, the op amp 520 $V_G$ output is nearly identical to the FET 526 gate-to-source voltage, $V_{GS}$. Thus, for notational simplicity, $V_{GS}$ will be used to indicate both the FET's gate-to-source voltage, and the voltage at the gate of the FET. In this embodiment of the invention, the FET 526 is operated in its linear operating region, which is characterized for P-channel FETs by the equation:

$$V_{DS} > V_{GS} - V_{th}$$

where $V_{th}$ is the FET's threshold voltage, $V_{DS}$ is the drain-to-source voltage, and all voltages being negative as is typical for a P-channel application. With FET 526 operating in the linear region, the gate-to-source voltage, $V_{GS}$, controls the FET's 526 resistance to the current transmitted through the FET 526. The relationship between the resistance of the FET 526, $R_{FET}$, and the resistance of the associated memristor 610, $R_{MEMRISTOR}$, are approximately equal and can be represented mathematically as follows:

$$R_{FET} \approx R_{MEMRISTOR}$$

As long as the FET's 526 resistance $R_{FET}$ as set by the op amp 520 is maintained to preserve a fixed relationship with the associated memristor's 610 resistance $R_{MEMRISTOR}$, the memristor's 610 resistance can be inferred from the gate-to-source voltage $V_{GS}$, which is accomplished by also inputting the voltage $V_{GS}$ to the comparator 528 and comparing $V_{GS}$ with the reference voltage $V_{ref}$. The comparator 528 outputs a logic-level value indicative of the memristor's 610 resistance state.

In certain embodiments, the reference row wire 516 is configured to have a similar resistance profile as the row wires of the crossbar array, and experiences a voltage droop of approximately equal magnitude, but of opposite polarity, as the voltage droop of the selected row wire. FIG. 6 includes a plot 614 of the reference row wire voltages at the FETs of the sense amps 512-514, as represented by points 616-618, respectively. The magnitude of the drain-to-source voltages, $V_{DS}$, across the FETs is approximately equal to the magnitude of the voltages across the memristors 610-612, but the voltages have opposite polarity. Dotted curve 620 represents the voltage $V_{REFROW}(x)$ along the reference row wire 516, which approximately matches the voltage $V_{SELROW}$ along the selected row wire 501 (i.e., $-V_{REFROW}(x) \approx +V_{SELROW}(x) \times (-1)$). Thus, the drain-to-source voltage across the FETs of the sense amps 512-514 are approximately equal in magnitude to the voltages, applied to the corresponding memristors but with opposite polarity. In other words, a FET of a sense amp experiences a drain-to-source voltage that droops nearly identically to the voltage across the corresponding memristor being read (i.e., $V_{MEMRISTOR}(x) \approx V_{FET}(x)$). Additionally, the current through both devices is approximately equally due to the negligible bias current entering the op amp (i.e., $I_{MEMRISTOR} \approx I_{FET}$). It follows that:

$$R_{MEMRISTOR} = \frac{V_{MEMRISTOR}}{I_{MEMRISTOR}} \approx \frac{V_{FET}}{I_{FET}} = R_{FET}$$

In other words, even in the presence of row wire voltage droop, the FET of the sense amp will be set to a resistance equal to that of its associated memristor. Since the FET's gate-to-source voltage, $V_{GS}$, reflects its resistance (i.e., $R_{FET}$), it will also reflect the associated column memristor's resistance state (i.e., $R_{MEMRISTOR}$). This demonstrates an advantage of the invention over the prior art designs, in which $V_{GS}$ would reflect merely the memristor's current, which would be affected by a drooping row wire voltage. Because embodiments of the present invention stabilize $V_{GS}$, even in the presence of row wire voltage droop, the comparator of the sense amp can make an accurate determination of the associated memristor's logic state (i.e., "0" or "1") by comparing the $V_{GS}$ to a stable and fixed reference voltage $V_{REF}$.

Figure 7:
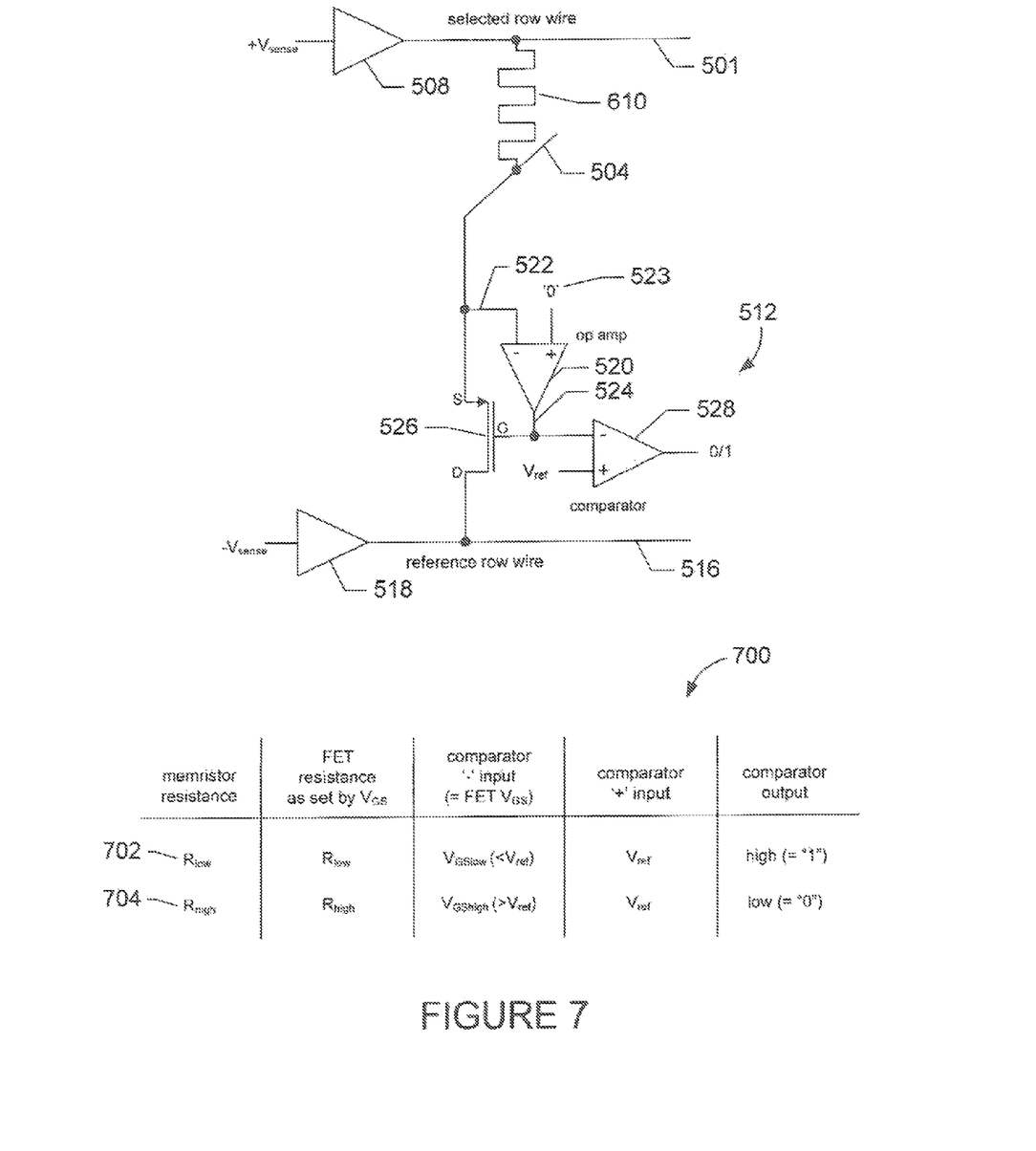
FIG. 7 shows a circuit diagram of a memristor and associated sense amp and a table of example circuit operation in accordance with one or more embodiments of the present invention.

FIG. 7 shows a circuit diagram of the memristor 610, associated sense amp 512, and a table 700 representing example operation of the sense amp 512 in accordance with one or more embodiments of the present invention. The row wire driver 508 drives a voltage +$V_{sense}$ that is applied, minus the row wire voltage droop, to one terminal of memristor 610. This voltage creates a current through the memristor 610 that is input to the source S of the FET 526 and negligibly to the input 522 of the op amp 520. The op amp 520 is also input "0" volts, or a low voltage, at a second input 523. The op amp 520 amplifies the difference between the two inputs 522 and 523 so that, in the presence of a negative feedback circuit path from the op amp output 524 to its inverting input, the voltage between the two inputs is minimized (i.e., the column wire voltage, or equivalently the FET source input, is driven to '0' volts). With the FET source terminal at '0' volts, the op amp output 524 is equivalent to the FET's gate-to-source voltage $V_{GS}$, which controls the size and shape of a conductive channel (i.e., resistance) through which current flows through the FET 526. The FET 526 is configured to operate like a variable resistor with a resistance that approximately matches the resistance of the associated memristor 610, provided the gate-to-source voltage $V_{GS}$ is greater in magnitude than the threshold voltage of the FET 526 by an amount greater than the magnitude of the FET's 526 drain-to-source voltage. In light of this constraint and others involving available power supply voltages and memristor "on"-state and "off"-state resistances, the parameters of the FET 526 may be specified to control the relationship between the FET 526 $V_{GS}$ and the resulting FET 526 resistance. Adjustable FET parameters include, but are not limited to, the ratio of the FET's gate width W to the FET's gate length L (i.e., W/L). In the example described with reference to Table 700, a logic "0" bit value corresponds to a high-resistance state and a logic "1" bit value corresponds to a low-resistance state. Consider the example represented by the first row 702 in the table 700, where the memristor 610 is assumed to have a state characterized by a low resistance. $R_{low}$. When the selected and reference row wires are driven by +$V_{sense}$ and -$V_{sense}$, respectively, and after the feedback loop involving the op amp 520 has forced the column wire to a virtual '0' volts, the FET resistance will also be $R_{low}$. Since it takes a relatively large negative value of $V_{GS}$ to turn the FET 526 on to a low resistance, $V_{GSlow}$ will be more negative than the reference voltage $V_{REF}$, which is also a negative voltage. Since the comparator's positive input, $V_{REF}$, is greater than its negative input, $V_{GSlow}$, the comparator 528 outputs a high voltage indicating a logic "1" bit value. Alternatively, consider the example represented by the second row 704 in the table 700, where the memristor 610 is assumed to have a state characterized by a high resistance $R_{high}$. When the selected and reference row wires are driven by +$V_{sense}$ and -$V_{sense}$, respectively, and after the feedback loop involving the op amp 520 has driven the column wire to a virtual '0' volts, the FET 526 resistance is also $R_{high}$. Since it takes a relatively small negative value of $V_{GS}$ to turn the FET on weakly to a high resistance, the $V_{GShigh}$ is less negative than the reference voltage $V_{REF}$. Since the comparator's positive input, $V_{REF}$, is less than its negative input, $V_{GShigh}$, the comparator 528 outputs a low voltage indicating a logic "0" bit value. The voltage difference between $V_{REF}$ and the expected values of $V_{GSlow}$ and $V_{GShigh}$ can be balanced by choosing $$V_{REF} = (V_{GSlow} + V_{GShigh})/2$$

Electromigration is the process by which wires with repeated use wick down and eventually fail. Electromigration can be an issue on row wires of a crossbar, because selected row wires can carry the current of a full row of selected crossbar junctions. In the system embodiments described above, the reference row wire 516 is especially prone to electromigration because the reference row wire 516 is used on every read, and therefore, is more likely to fail before any individual row wire of the crossbar array. In certain system embodiments, in order to reduce the likelihood of the reference row wire 516 failing due to electromigration, the reference row wire 516 can be fabricated with a larger cross-sectional area than the cross-sectional areas of the row wires of the crossbar array. This can be accomplished by any number of means including fabricating a wider reference row wire, a taller wire, multiple parallel wires, etc. Increasing the cross-sectional area along the entire length of the reference row wire 516 reduces the resistance of the reference row wire 516 by a factor k, which is represented mathematically by:

$$R_{refwire} \approx \frac{R_{wire}}{k}$$

where $R_{wire}$ is the resistance of row wire of the crossbar array, and k is a number greater than "1." With the resistance of the reference row wire scaled down by a factor k, and with the reference row wire still carrying a current profile identical to the selected row wire, the reference row wire voltage droop is a factor k less than the voltage droop of the selected row wire. In order for the proportion of voltage droop along the reference row wire 516 to approximate the proportion of voltage droop along a selected row wire, as described above with reference to FIG. 6, the -$V_{sense}$ voltage rail is scaled by k to -$V_{sense}$/k. With -$V_{sense}$ scaled by a factor of k, and with the FETs passing the same current as described above with reference to FIGS. 6 and 7, each op amp outputs a gate-to-source voltage to a corresponding FET such that the resistance of the FET is given by:

$$R_{FET} \approx \frac{R_{MEMRISTOR}}{k}$$

where $R_{MEMRISTOR}$ is the resistance of an associated memristor. Note that a $V_{GS}$ output from an op amp is not necessarily scaled by the factor k. Because both the voltage droop along the reference row wire and are scaled by a factor k, the voltage droop in -$V_{sense}$/k is substantially proportionately the same as the voltage droop in +$V_{sense}$, allowing the k:1 ratio of the FET's resistance to the memristor's resistance to be maintained. Another potential advantage of this k-scaled embodiment of the invention is the reduction in magnitude of the FET's drain-to-source voltage. This permits the FET to be controlled in its linear region with a smaller magnitude gate-to-source voltage, which may make it easier to apply embodiments of the present invention in a system with power supply voltage constraints.

Figure 8:
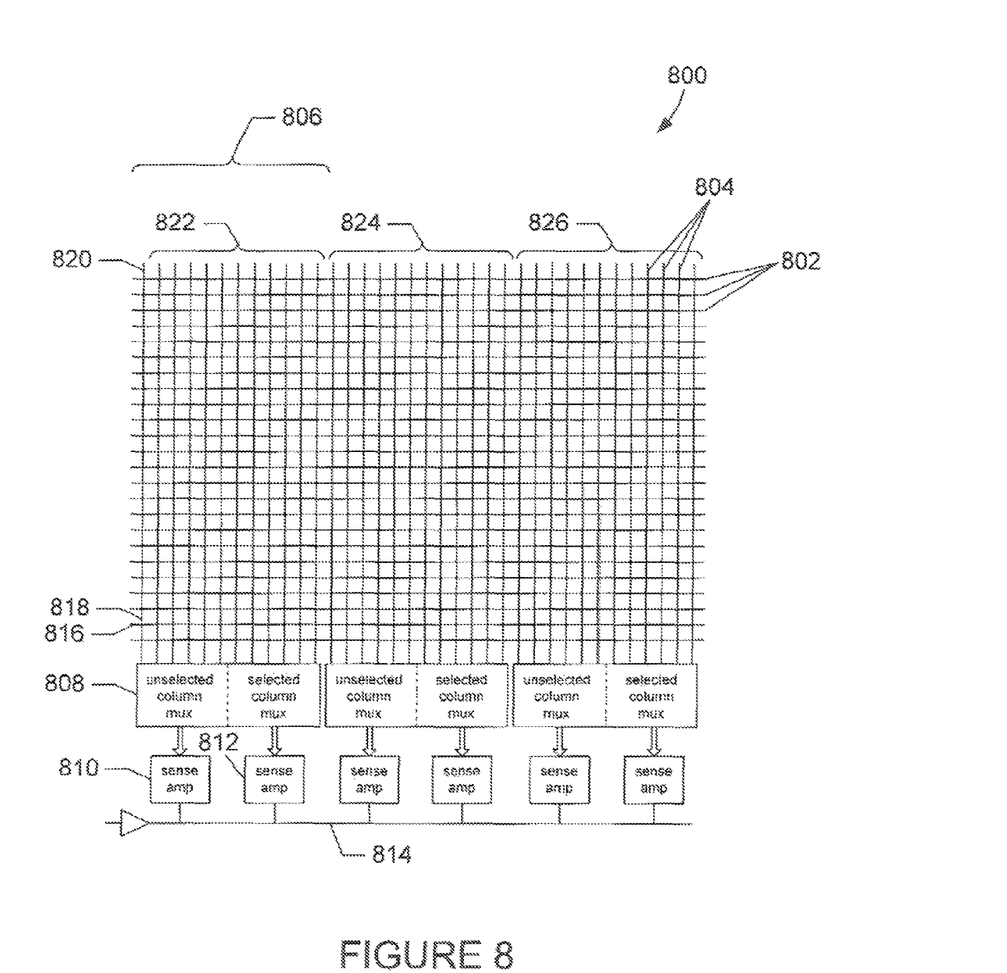
FIG. 8 shows a schematic representation of a crossbar array and sense amps configured in accordance with one or more embodiments of the present invention.

In certain implementations, it may not be possible to practically fabricate the above described sense amp design for every column wire without also reducing the effectiveness and other useful advantages offered by the compact crossbar array design. In certain embodiments, multiplexers can be used to reduce the number of sense amps. FIG. 8 shows a schematic representation of a crossbar array 800 and sense amps configured in accordance with one or more embodiments of the present invention. The crossbar array 800 is composed of 24 row wires 802 and 36 column wires 804 connected by memristor devices (not shown). As shown in the example of FIG. 8, the 36 column wires 804 are grouped into blocks of 12 column wires, where each block of 12 column wires is connected to a multiplexer assembly. For example, a block 806 of 12 column wires is connected to a multiplexer assembly 808. Each multiplexer assembly is connected to two sense amps, which are connected to a reference row wire 814, as described above. For example, multiplexer assembly 808 is connected to sense amps 810 and 812. The sense amps are configured and operated as described above with reference to FIGS. 5 and 6. Note that by introducing multiplexer assemblies, as shown in the example of FIG. 8, the number of sense amps is reduced from 36, one for each column wire as described above with reference to FIGS. 5-7, to just 6 sense amps.

FIG. 8 also reveals that each multiplexer assembly is composed of an unselected column multiplexer and a selected column multiplexer. The sense amps 810 and 812 are shared in turn by each of the column wires within a block of column wires. For example, the block of column wires 806 shares the sense amps 810 and 812. The resistance states of the memristors located along a selected row wire are read one-at-a-time within each block of column wires. For example, consider the memristors located along a selected row wire 816. The multiplexer assembly 808 is operated so that the resistance state of each memristor located along the selected row wire 816 and connected to a column wire within the block 806 is read one-at-a-time. The resistance state of the memristor located at the crossbar junction 818 is read by operating the selected column multiplexer so that the current flowing along column wire 820 is directed into the sense amp 812, which is operated as described above with reference to FIG. 7. On the other hand, each of the unselected column wires 822 are switched by the unselected column multiplexer to the sense amp 810. The sense amp 810 imposes a virtual '0' volts on the unselected column wires 822 while also loading the reference wire 814 appropriately. The above described process is repeated for each of the memristors located along the selected row wire 816 within the block 806. The process of reading the resistance states along the selected row wire 816 performed on the block of wires 806 can also be performed simultaneously on the other blocks of column wires 824 and 826.

Figure 9:
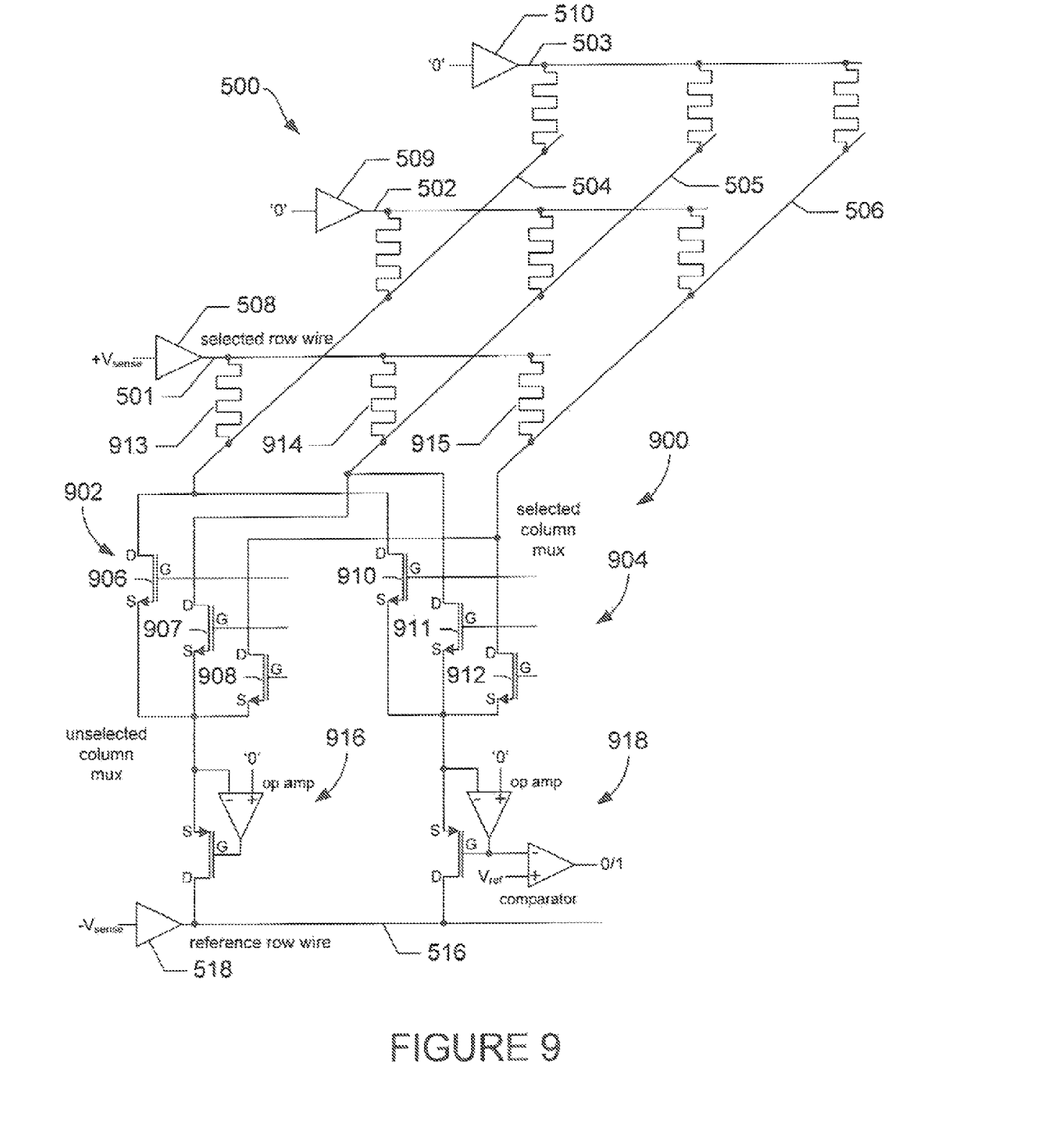
FIG. 9 shows a circuit diagram of a crossbar array and a multiplexer assembly configured in accordance with one or more embodiments of the present invention.

The multiplexers can be implemented with FETs to control the operations performed by the unselected and selected column multiplexers. FIG. 9 shows a circuit diagram of the crossbar array 500 and a multiplexer assembly 900 configured in accordance with one or more embodiments of the present invention. The multiplexer assembly 900 is composed of an unselected column multiplexer 902 and a selected column multiplexer 904. The column wires 504-506 can represent a block of column wires within a larger crossbar array. The column wires 504-506 are connected to the unselected column multiplexer 902 and the column wires 504-506 are also connected to the selected column multiplexer 904. Each column multiplexer includes the same number of FETs as the number of connected column wires. For example, unselected column multiplexer 902 includes three N-channel FETs 906-908 connected to the column wires 504-506, respectively, and selected column multiplexer 904 also includes N-channel FETs 910-912 connected to the same column wires 504-506. Note the source, drain, and gate for each of the FET's 906-908 and 910-912 are also identified using S, D, and G designations.

Operation of the unselected and selected column multiplexers is now described with reference to an example. Suppose the resistance state of the memristor 914 is to be read. A voltage $+V_{sense}$ is applied to the selected row wire 501 and 0 volts are applied to the row wires 502 and 503 as described above with reference to FIG. 5. The unselected column multiplexer 902 is operated by applying appropriate gate-to-source voltages that place the FET 907 in a high-resistance state and place the FETs 906 and 908 in a low-resistance state, allowing only the current flowing through memristors 913 and 915 to reach the sense amp 916. On the other hand, the selected column multiplexer 904 is operated by applying appropriate gate-to-source voltages that place the FET 911 in a low-resistance state and the FETs 910 and 912 in a high-resistance state, allowing only the current flowing through the selected memristor 914 to reach the sense amp 918. The sense amp 918 is operated to determine the resistance state of the memristor 914, as described above with reference to FIG. 7. The sense amp 916 is operated to pass the current from the unselected column wires 504 and 506 into the reference row wire, while maintaining those wire at a virtual '0' volts. Since no logic determination is made by sense amp 916, the comparator described above with reference to FIGS. 5-7 is not needed.

Figure 10:
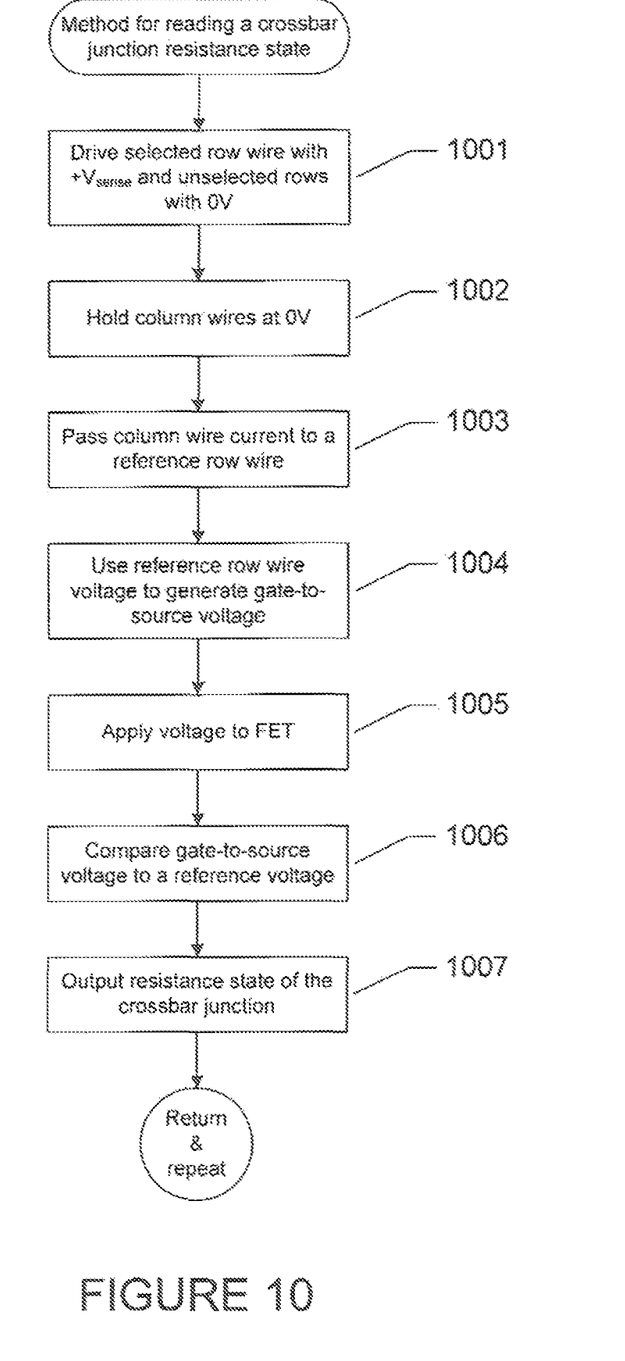
FIG. 10 shows a flow diagram of a method for reading a crossbar junction resistance state in accordance with one or more embodiments of the present invention.

FIG. 10 shows a flow diagram of a method for reading a crossbar junction resistance state in accordance with one or more embodiments of the present invention. Method embodiments of the present invention are not limited to steps being performed in a particular order. It may be the case that certain steps can be performed substantially simultaneously or in a different order. In step 1001, a selected row wire is driven with a sense voltage $+V_{sense}$ and unselected row wires are driven with approximately 0 volts, as described above with reference to FIG. 5. In step 1002, column wires are held at a virtual '0' volts, as described above with reference to FIG. 5. In step 1003, column wire current is passed to a reference row wire. In step 1004, based on the current that passes through the crossbar junction, a voltage is generated that reflects the crossbar junction's resistance, as described above with reference to FIG. 7. In step 1005, the voltage is applied to a FET such that the FET has approximately the same resistance as the memristor located at the crossbar junction. In step 1006, the gate-to-source voltage is compared to a reference voltage in order to determine the resistance state of the memristor located at the crossbar junction. In step 1007, the resistance state of the crossbar junction is output.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A system for determining resistance states at crossbar junctions of a crossbar array, the system comprising:

one or more sense amplifiers connected to column wires of the crossbar array;

a reference row wire connected to each sense amp; and a wire driver connected to the reference row wire and configured to drive the reference row wire, wherein the sense amplifiers are configured so that when a selected row wire of the crossbar array is driven by a sense voltage, the column wires are held at approximately zero volts and pass currents through the column wires and sense amplifiers to the reference row wire so that resistive voltage losses along the reference row wire substantially mirror the resistive voltage losses along the selected row wire allowing the sense amplifiers to determine the crossbar junction resistance states.

2. The system of claim 1 wherein each sense amplifier further comprises:
   an operation amplifier configured with a first input connected to at least one of the column wires and a second input connected to a voltage source;
   a field-effect transistor configured with a source, drain, and a gate, the source and drain connected to at least one of the column wires and the reference row wire, and the gate connected to an output of the operation amplifier; and
   a comparator configured with a first input connected to the output of the operation amplifier, a second input connected to a reference voltage source, and an output that outputs a voltage corresponding to the resistance state of an associated crossbar junction.

3. The system of claim 2 wherein the operation amplifier is configured to output a voltage to the field-effect transistor based on the voltage difference between the voltages received at the first and second inputs, the voltage setting the resistance of the field-effect transistor approximately equal to the resistance of the associated crossbar junction.

4. The system of claim 2 wherein the operation amplifier is configured to output a voltage to the comparator based on the voltage difference between the voltages received at the first and second inputs, the comparator comparing the voltage to a reference voltage generated by the reference voltage source to determine the resistance state of the associated crossbar junction.

5. The system of claim 1 wherein each crossbar junction further comprises a memristor.

6. The system of claim 1 wherein each row wire of the crossbar array further comprises a row wire driver configured to apply a voltage to a corresponding row wire.

7. The system of claim 1 wherein the reference row wire has a cross-sectional area throughout the length of the reference row wire that is approximately equal to the cross-sectional areas throughout the lengths of the row wires of the crossbar array.

8. The system of claim 1 wherein the reference row wire has a larger cross-sectional area throughout the length of the reference row wire than the cross-sectional areas throughout the row wires of the crossbar array.

9. The system of claim 1 wherein each sense amplifier is connected to one column wire.

10. The system of claim 1 further comprising one or more column wire multiplexer assembly disposed between the one or more sense amplifiers and the columns of the crossbar array, wherein each column wire multiplexer assembly is connected to a block of column wires and is connected to two sense amplifiers.

11. The system of claim 10 where each block of column wires uses one sense amplifier to output the resistance states of crossbar junctions along a selected row wire.

12. A method for determining the resistance states of a row of crossbar junctions of a crossbar array, the method comprising:
   driving a selected row wire corresponding to the crossbar junctions with a sense voltage;
   holding column wires connected to the selected row wire through crossbar junctions at approximately zero volts;
   passing column wire currents into a reference row wire;
   for each crossbar junction,
      using the voltage of the reference row wire to generate a voltage that reflects the crossbar junction's resistance; and
      determining the resistance state of the crossbar junction by comparing the voltage to reference voltages.

13. The method of claim 12 further comprising driving non-selected row wires with approximately zero volts.

14. The method of claim 12 further comprising applying the generated voltage to the gate terminal of a field-effect transistor that connects the column wires to a reference row wire such that the reference row wire carries a voltage with approximately the same proportional voltage droop but of opposite polarity to the voltage droop of the selected row wire.

15. The method of claim 12 wherein the crossbar junction further comprises a memristor.

* * * * *